(12) United States Patent
Sauter et al.

(10) Patent No.: US 11,095,084 B1
(45) Date of Patent: Aug. 17, 2021

(54) LASER SYSTEM WITH ISOLATED OPTICAL CAVITY

(71) Applicants: Matthew Sauter, Boston, MA (US);
Bryan Lochman, Nashville, TN (US);
Bien Chann, Merrimack, NH (US)

(72) Inventors: Matthew Sauter, Boston, MA (US);
Bryan Lochman, Nashville, TN (US);
Bien Chann, Merrimack, NH (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 13 days.

(21) Appl. No.: 16/784,459

(22) Filed: Feb. 7, 2020

Related U.S. Application Data

(60) Provisional application No. 62/802,281, filed on Feb. 7, 2019.

(51) Int. Cl.
| | |
|---|---|
| H01S 5/024 | (2006.01) |
| H01S 3/04 | (2006.01) |
| H01S 3/08 | (2006.01) |
| H01S 5/40 | (2006.01) |
| H01S 3/067 | (2006.01) |
| H01S 5/02255 | (2021.01) |
| H01S 5/14 | (2006.01) |
| H01S 3/081 | (2006.01) |

(52) U.S. Cl.
CPC .......... *H01S 3/0407* (2013.01); *H01S 3/0401* (2013.01); *H01S 3/08059* (2013.01); *H01S 5/02423* (2013.01); *H01S 5/4012* (2013.01); *H01S 3/067* (2013.01); *H01S 3/0811* (2013.01); *H01S 5/02255* (2021.01); *H01S 5/141* (2013.01); *H01S 5/4062* (2013.01); *H01S 5/4075* (2013.01); *H01S 5/4081* (2013.01); *H01S 5/4087* (2013.01)

(58) Field of Classification Search
None
See application file for complete search history.

(56) References Cited

U.S. PATENT DOCUMENTS

| | | | | |
|---|---|---|---|---|
| 5,105,429 | A * | 4/1992 | Mundinger | H01S 5/4025 372/34 |
| 5,764,675 | A * | 6/1998 | Juhala | H01S 5/02423 372/50.1 |
| 2018/0191135 | A1* | 7/2018 | Yanase | G02B 27/0916 |
| 2018/0278013 | A1* | 9/2018 | Kanskar | H01S 3/094003 |
| 2020/0176954 | A1* | 6/2020 | Whitmore | H01S 5/143 |

FOREIGN PATENT DOCUMENTS

WO WO-2014126124 A1 * 8/2014 ............. H01S 5/405

* cited by examiner

*Primary Examiner* — Tod T Van Roy
(74) *Attorney, Agent, or Firm* — Morgan, Lewis & Bockius LLP

(57) ABSTRACT

In various embodiments, laser resonator modules produce output beams via manipulation of input beams on opposite sides of the module. The input beams are emitted by one or more beam emitters that may be cooled using a liquid coolant cavity. The liquid coolant cavity may be isolated from optical elements utilized to manipulate the input beams, at least in part, by an isolation wall protruding from the base plate of the resonator module.

23 Claims, 8 Drawing Sheets

LASER SYSTEM WITH ISOLATED OPTICAL CAVITY

RELATED APPLICATIONS

This application claims the benefit of and priority to U.S. Provisional Patent Application No. 62/802,281, filed Feb. 7, 2019, the entire disclosure of which is hereby incorporated herein by reference.

TECHNICAL FIELD

In various embodiments, the present invention relates to laser systems, specifically laser systems with isolated liquid cooling systems and optical cavities.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

The beam emitters in a high-power laser system, such as a WBC system, produce copious amounts of heat during operation and testing, and are therefore typically cooled to increase their longevity. Various system designs utilize active liquid cooling to draw heat away from the beam emitters, but such cooling systems can present various challenges and issues. For example, for optimum cooling the cooling liquid should be disposed as close as possible to the beam emitters; however, this risks contamination of the beam emitters or other optical elements in the system during operation and manufacturing. Contamination or coolant leakage could cause catastrophic failure of the system. In addition, the heat produced by the beam emitters may cause mechanical issues for the system. Such heating may result in thermal expansion or contraction of various parts of the system, which can disrupt the precise mechanical and optical alignment of the system components—this disruption may result in degradation of output power and optical performance of the system. In view of these issues, there is a need for solutions enabling high-efficiency cooling of the laser system, and its components (e.g., beam emitters) while maintaining mechanical stability of the system to ensure optimum optical performance.

SUMMARY

Emitter modules, also referred to as laser source or resonator modules (or simply, "resonators"), in accordance with embodiments of the invention feature an isolation wall that not only isolates the liquid coolant system from the optical cavity (and the optical elements and/or beam emitters therein), but also provides mechanical stability to resist thermal deformation that can lead to optical misalignment. Embodiments of the invention therefore decrease risk of coolant leaks and contamination during manufacturing, as the optical cavity of the resonator may be sealed while the cooling cavities are assembled and tested. The isolation wall is much less likely to fail or be breached during operation compared to other seals, such as o-rings, the failure of which may lead to catastrophic failure of the resonator in conventional systems. A sealed optical cavity may be hermetically sealed or enclosed, not necessarily in an airtight fashion, on all sides to resist the ingress of dust, moisture, and/or other debris or contamination. Optical cavities may be sealed, at least in part, by cover plates, the base plate of the resonator module, features such as walls that protrude from the resonator module, and/or any external wall defined by or attached to the resonator module.

Moreover, the isolation wall provides mechanical strength that opposes thermal expansion forces arising from the beam emitters and heat produced thereby, as well as mechanical forces applied by users or the environment. In various embodiments, the thickness of the isolation wall exceeds that of the resonator base plate, thereby providing enhanced strength thereto. This also enables the thickness of the resonator base plate to be reduced, which enhances the liquid cooling effect without sacrificing mechanical strength. In various embodiments, the thickness of the isolation wall ranges from approximately 1 mm to approximately 75 mm. In various embodiments, the thickness of the isolation wall ranges from approximately 50% to approximately 75% of the thickness of the outer wall surrounding the outer perimeter of the resonator module. Finally, the placement of the isolation wall allows the liquid cooling system and cavity to be inspected and cleaned (e.g., debris or contaminant removal) in the field, without the need to unseal the more delicate optical cavity.

Embodiments of the invention may include one or more components, interfaces, and/or control systems detailed in U.S. patent application Ser. No. 15/660,134, filed on Jul. 26, 2017 (the '134 application), and/or U.S. patent application Ser. No. 16/421,728, filed on May 24, 2019 (the '728 application), the entire disclosure of each of which is incorporated by reference herein. For example, resonator modules in accordance with embodiments of the invention may include electrical and optical interfaces that interface with complementary features on a beam-combining enclosure in which the individual beams from the modules are combined into a single output beam (and, in some embodiments, coupled into an optical fiber). The optical and electrical interfaces facilitate the easy replacement of input laser sources with a minimal amount, if any, of source alignment. The emitter modules may be insertable into and mate with input receptacles disposed in or on the enclosure in which the input beams are combined to form the output beam. Resonator modules may connect mechanically, electrically, and/or optically with one of multiple input receptacles disposed in or on (or forming portions of) the enclosure for the beam-combining optics.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that feature a layer of low bandgap material sandwiched between two high bandgap layers; quantum well lasers that include a very thin middle (quantum well) layer resulting in high efficiency and quantization of the laser's energy; multiple quantum well lasers that include more than one quantum well layer to improve gain characteristics; quantum wire or quantum sea (dots) lasers that replace the middle layer with a wire or dots to produce higher-efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting lasers (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Embodiments of the present invention may couple one or more laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser resonator that includes, consists essentially of, or consists of a base plate having a first side and a second side opposite the first side and surrounded by an external wall, a fluid inlet, and a fluid outlet. The external wall may protrude or extend from the base plate on the first side and/or the second side. A mounting area and a first optical cavity are disposed on the first side of the base plate. The mounting area is configured to receive a plurality of beam emitters. The first optical cavity is configured to manipulate beams emitted by the beam emitters. A liquid coolant cavity, a second optical cavity, and an isolation wall are disposed on the second side of the base plate. At least a portion of the liquid coolant cavity is disposed beneath at least a portion of the mounting area and is configured to receive liquid coolant therewithin. The isolation wall extends from the base plate and is disposed between the liquid coolant cavity and the second optical cavity. The second optical cavity may be configured to manipulate beams emitted by the beam emitters (e.g., beams received from the first optical cavity and/or from the beam emitters). The fluid inlet supplies the liquid coolant to the liquid coolant cavity, and the fluid outlet receives (i.e., outputs) the liquid coolant from the liquid coolant cavity.

Embodiments of the invention may include one or more of the following in any of a variety of combinations. The base plate may define one or more openings therethrough. The second optical cavity may be configured to receive beams from the first optical cavity through the opening(s). A thickness of a first portion of the base plate disposed between the first optical cavity and the second optical cavity may be greater than a thickness of a second portion of the base plate disposed between the liquid coolant cavity and the mounting area. A thickness of at least a portion of the isolation wall may be less than or approximately equal to a thickness of at least a portion of the external wall. A height of the isolation wall may be approximately equal to a height of a portion of the external wall extending from the second side of the base plate.

The isolation wall may surround an entirety of or a portion of a perimeter of the second optical cavity. All or a portion of the perimeter of the liquid coolant cavity may be surrounded by the isolation wall. All or a portion of the perimeter of the liquid coolant cavity may be collectively surrounded by the isolation wall and the external wall. The external wall may abut or be disposed adjacent to one or more sides of the liquid coolant cavity, and/or the isolation wall may abut or be disposed adjacent to one or more sides of the liquid coolant cavity. The laser resonator may include a first cover plate configured to seal against a sealing path surrounding the perimeter of, and thereby enclose, the first optical cavity and the mounting area. The laser resonator may include a second cover plate configured to seal against a sealing path surrounding a perimeter of the second optical cavity, thereby enclosing the second optical cavity. The second cover plate may not cover or enclose the liquid coolant cavity.

The laser resonator may include a dispersive element and/or a partially reflective output coupler disposed within the second optical cavity. The dispersive element may be configured to combine a plurality of beams into a combined (e.g., multi-wavelength) beam. The partially reflective output coupler may be configured to receive the combined beam from the dispersive element, transmit a first portion of the combined beam as an output beam, and reflect a second portion of the combined beam back toward the dispersive element (and, e.g., thence to one or more beam emitters to form an external cavity lasing system). The dispersive element may include, consist essentially of, or consist of a diffraction grating (e.g., a transmissive diffraction grating or a reflective diffraction grating) and/or one or more prisms. The plurality of beam emitters may be disposed within the mounting area. At least one of (or even each of) the beam emitters may include, consist essentially of, or consist of a diode bar configured to emit a plurality of discrete beams. One or more optical elements may be disposed within the first optical cavity. One or more optical elements may be disposed within the second optical cavity.

The isolation wall and the base plate may be portions of (i.e., formed from and shaped from) a single volume of material. The isolation wall and the base plate may be portions of (i.e., formed from and shaped from) separate volumes of material that are attached together. The isolation wall may be attached to the base plate. The isolation wall may be attached to the base plate via an adhesive material, a solder joint, and/or a brazing joint. The isolation wall may include, consist essentially of a first material. The base plate may include, consist essentially of a second material. The first and second materials may be the same or different. The laser resonator may include a fluid reservoir configured to fit within the liquid coolant cavity and contain the liquid coolant. The fluid reservoir may include thereon or interface with the fluid inlet and/or the fluid outlet.

In another aspect, embodiments of the invention feature a laser resonator that includes, consists essentially of, or consists of a base plate that defines one or more openings therethrough. A mounting area and a first optical cavity are disposed on the first side of the base plate. The mounting area is configured to receive a plurality of beam emitters. The first optical cavity is configured to manipulate beams emitted by the beam emitters. A second optical cavity is disposed on the second side of the base plate. The second optical cavity is configured to receive beams from the first optical cavity through one or more of the openings. The second optical cavity may be configured to manipulate (e.g., combine) the received beams.

Embodiments of the invention may include one or more of the following in any of a variety of combinations. The plurality of beam emitters may be disposed or received within the mounting area. At least one of (or even each of) the beam emitters may include, consist essentially of, or consist of a diode bar configured to emit a plurality of discrete beams. One or more first optical elements may be disposed within the first optical cavity. The one or more first optical elements may include, consist essentially of, or consist of a plurality of collimation lenses and/or a plurality of reflectors. The one or more first optical elements may include, consist essentially of, or consist of a plurality of slow-axis collimation lenses (or a plurality of fast-axis collimation lenses) and a plurality of interleaver mirrors. The one or more first optical elements may include, consist essentially of, or consist of one or more folding mirrors.

One or more second optical elements may be disposed within the second optical cavity. The one or more second optical elements may include, consist essentially of, or consist of (i) a dispersive element for combining a plurality of beams into a combined (e.g., multi-wavelength) beam, and (ii) a partially reflective output coupler for receiving the combined beam from the dispersive element, transmitting a first portion of the combined beam as an output beam, and reflecting a second portion of the combined beam back toward the dispersive element. The dispersive element may include, consist essentially of, or consist of a diffraction grating (e.g., a transmissive diffraction grating or a reflective diffraction grating) and/or one or more prisms. The laser resonator may include a beam output for outputting the output beam. The beam output may include, consist essentially of, or consist of a window and/or a coupler configured to connect to an optical fiber. The one or more second optical elements may include, consist essentially of, or consist of one or more folding mirrors.

The laser resonator may include a beam output for outputting one or more beams manipulated within the first optical cavity and/or the second optical cavity. The beam output may include, consist essentially of, or consist of a window and/or a coupler configured to connect to an optical fiber. The laser resonator may include a liquid coolant cavity, a fluid inlet, and a fluid outlet. The liquid coolant cavity may be disposed beneath the mounting area and configured to receive liquid coolant therewithin. The fluid inlet may supply the liquid coolant to the liquid coolant cavity, and the fluid outlet may receive (i.e., output) the liquid coolant from the liquid coolant cavity. The laser resonator may include a fluid reservoir configured to fit within the liquid coolant cavity and contain the liquid coolant. The laser resonator may include an isolation wall extending from the base plate and disposed between the liquid coolant cavity and the second optical cavity. The isolation wall may include, consist essentially of a first material. The base plate may include, consist essentially of a second material. The first and second materials may be the same or different.

In yet another aspect, embodiments of the invention feature a method of producing an output laser beam. A plurality of input beams is emitted from one or more beam emitters disposed on a first side of a resonator module. The input beams are transmitted or directed through an opening defined by the resonator module to an optical cavity on a second side of the resonator module opposite the first side. The beams may be manipulated (e.g., reflected, focused, collimated, rotated, etc.) on the first side of the resonator module before being directed to the optical cavity on the second side of the resonator module. The input beams are combined into a combined beam within the optical cavity on the second side of the resonator module. The beams and/or the combined beam may be manipulated (e.g., reflected, focused, collimated, rotated, etc.) on the second side of the resonator module. At least (or only) a portion of the combined beam is emitted out of the resonator module as an output beam.

Embodiments of the invention may include one or more of the following in any of a variety of combinations. Combining the input beams into a combined beam may include, consist essentially of, or consist of wavelength-dispersing the input beams to form a multi-wavelength combined beam. Emitting at least a portion of the combined beam out of the resonator module may include, consist essentially of, or consist of (i) reflecting a first portion of the combined beam back to the one or more beam emitters and (ii) transmitting a second portion of the combined beam as the output beam. The output beam may be emitted into free space or into an optical fiber. The first side of the resonator module may include a second optical cavity thereon. The optical cavity and the second optical cavity may collectively define at least a portion of an external cavity for the one or more beam emitters.

The input beams may be collimated and/or converged toward a focal point prior to being transmitted through the opening. The input beams may be collimated along a slow axis and/or along a fast axis. The input beams may be rotated prior to being transmitted through the opening. One or more (or even all) of the input beams may be rotated by approximately 90°. Within the optical cavity on the second side of the resonator module, at least a portion of the combined beam may be directed through an optical telescope (e.g., two lenses such as two cylindrical or spherical lenses) for mitigation of optical cross-talk. One or more (or even each) of the input beams may have a different wavelength. The output beam may be a multi-wavelength beam. Heat may be removed from the one or more beam emitters by flowing a liquid coolant through a liquid coolant cavity disposed on the second side of the resonator module. The resonator module may include an isolation wall disposed between the optical cavity and the liquid coolant cavity.

In another aspect, embodiments of the invention feature a method of maintaining a laser resonator including, consisting essentially of, or consisting of (A) a base plate having a first side and a second side opposite the first side, (B) disposed on the first side of the base plate, (i) a mounting area configured to receive a plurality of beam emitters, (ii) a first optical cavity for manipulation of beams emitted by the beam emitters, and (iii) a plurality of first optical elements disposed within the first optical cavity, and (C) disposed on the second side of the base plate, (i) a liquid coolant cavity disposed beneath the mounting area and configured to receive liquid coolant therewithin, (ii) a sealed second optical cavity, and (iii) a plurality of second optical elements disposed within the second optical cavity. The method may include, consist essentially of, or consist of servicing the liquid coolant cavity without unsealing the sealed second optical cavity.

Embodiments of the invention may include one or more of the following in any of a variety of combinations. An isolation wall may be disposed on the second side of the base plate and may partially seal the second optical cavity. The isolation wall may extend from the base plate and may be disposed between the liquid coolant cavity and the second optical cavity. Servicing the liquid coolant cavity may include, consist essentially of, or consist of (i) cleaning at least a portion of the liquid coolant cavity, (ii) adjusting or replacing a reservoir disposed within the liquid coolant cavity, (iii) inspecting the liquid coolant cavity, and/or (iv) removing debris and/or one or more contaminants from the liquid coolant cavity. Servicing the liquid coolant cavity may include, consist essentially of, or consist of flowing liquid coolant into the liquid coolant cavity and/or flowing liquid coolant out of the liquid coolant cavity. The first optical cavity may be sealed. The liquid coolant cavity may be serviced without unsealing the first optical cavity.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. The term "consists essentially of" means excluding other materials that contribute to function, unless otherwise defined herein. Nonetheless, such other materials may be present, collectively or individually, in trace amounts. For example, a structure "consisting essentially of" one or more materials may include the one or more materials and unintentional impurities (e.g., impurities not intentionally introduced and/or present at insufficient concentrations to contribute to function; such impurities may be detectable via chemical analysis). Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. All distances herein are assumed to be optical distances unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
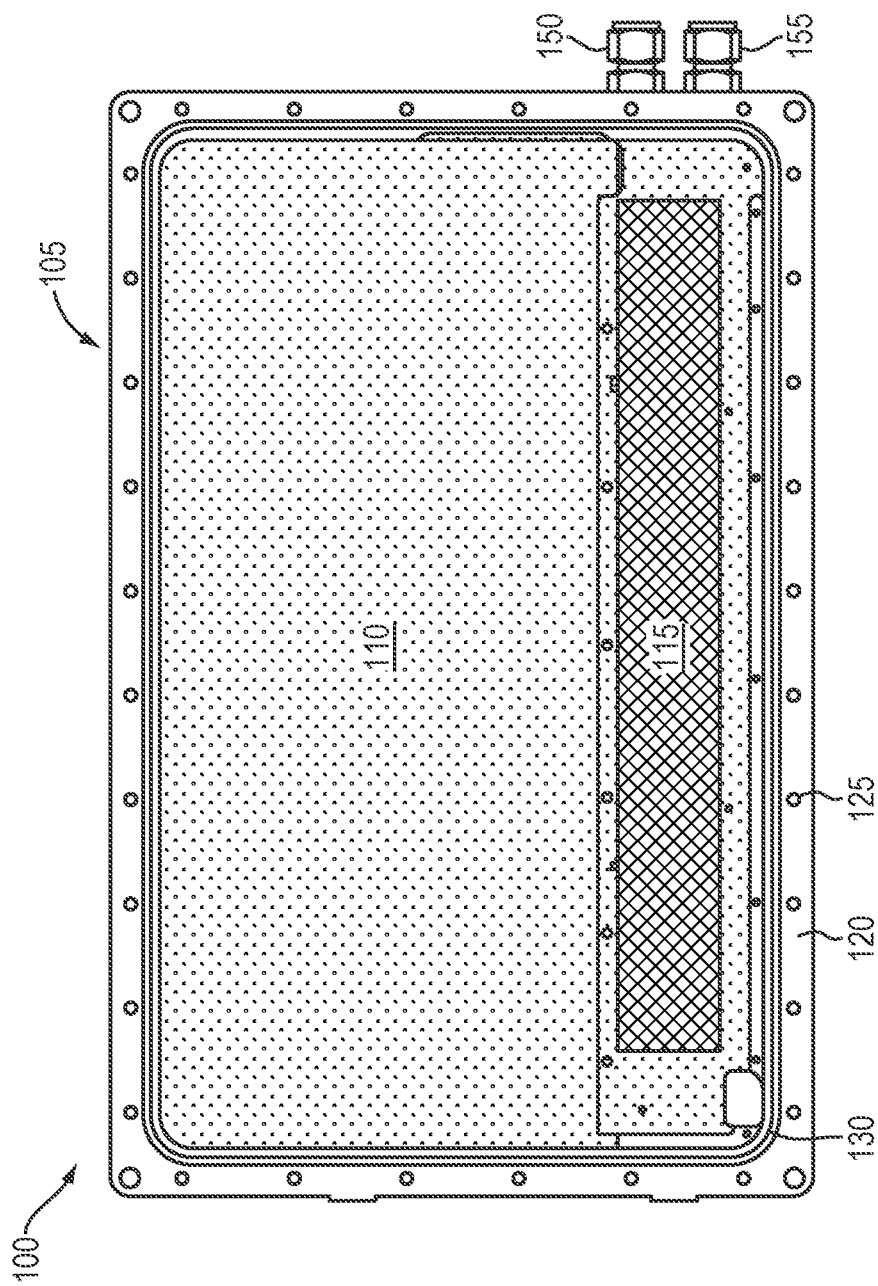
FIG. 1A is a schematic view of a first side of a laser resonator in accordance with various embodiments of the invention.
Figure 1B:
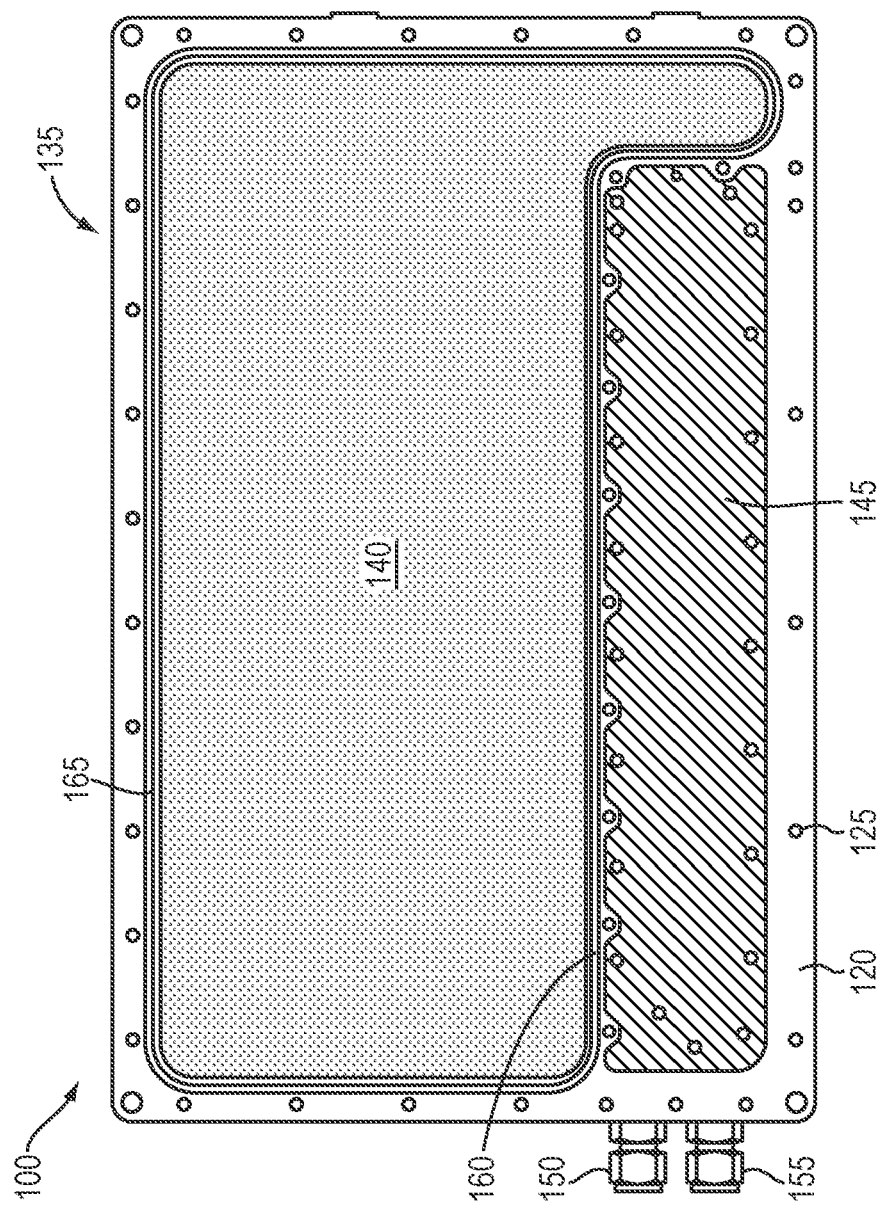
FIG. 1B is a schematic view of a second side of a laser resonator in accordance with various embodiments of the invention.
Figure 1C:
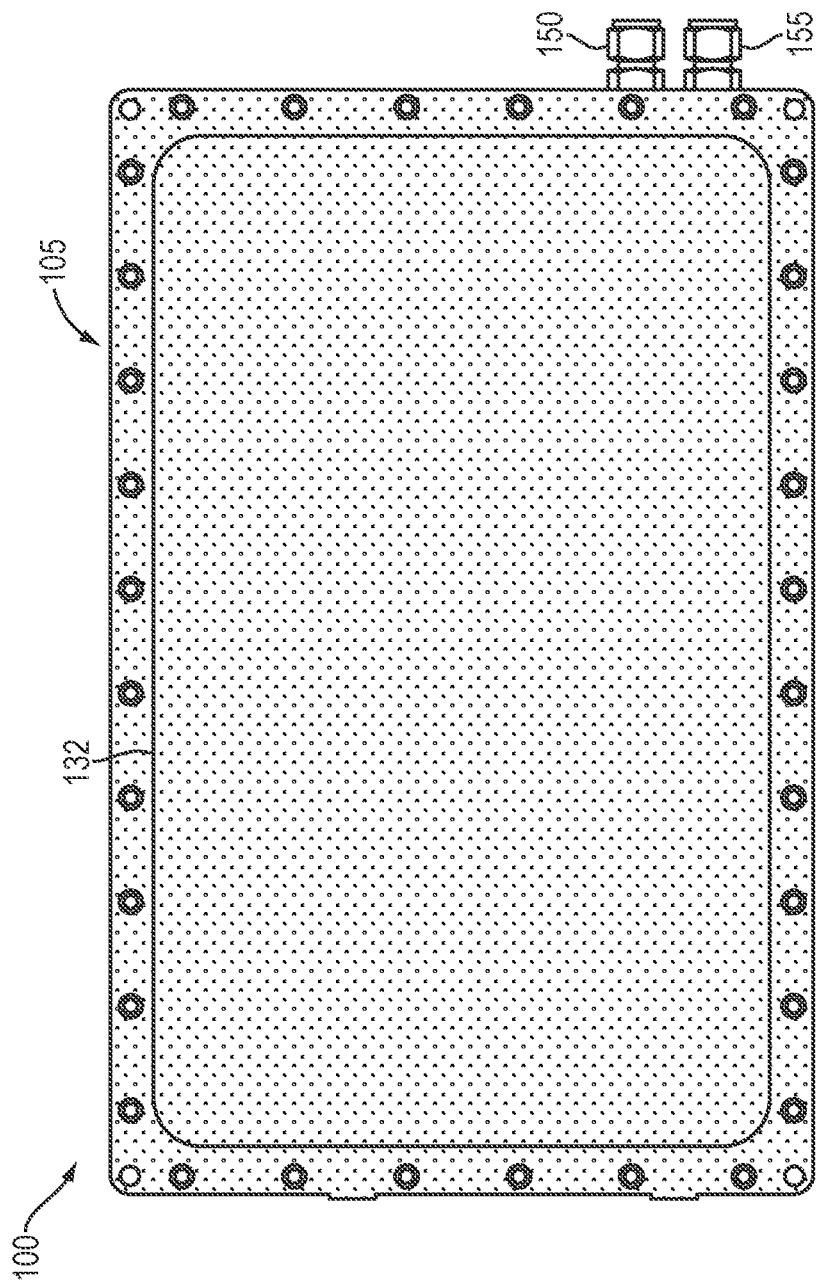
FIG. 1C is a schematic view of the first side of the laser resonator of FIG. 1A with a cover plate in place in accordance with various embodiments of the invention.

FIGS. 1A and 1B schematically depict opposing sides of a laser resonator 100 in accordance with embodiments of the present invention. As shown in FIG. 1A, a first side 105 of the resonator 100 features an optical cavity 110 within which one or more optical elements (e.g., mirrors, prisms, lenses, etc.) are utilized to manipulate laser beams emitted by one or more (typically a plurality of) beam emitters. Also on side 105 is a mounting area 115 for the beam emitters. As best observed in FIG. 2, the optical cavity 110 and mounting area 115 are supported by and separated from the second side of the beam emitter by a base plate that extends across the resonator 100. The optical cavity 110 and mounting area 115 are surrounded by a protruding external wall 120 that may define a plurality of apertures 125 that may be utilized to help seal the optical cavity 110 and mounting area 115 along a sealing path 130. For example, as shown in FIG. 1C, one or more cover plates 132 may be disposed over side 105 and may be fastened to resonator 100 via fasteners (e.g., screws, bolts, rivets, etc.) that extend into (and may mechanically engage with, e.g., threadingly engage with) apertures 125. In other embodiments, the cover plate(s) may be sealed along the sealing path 130 via a technique such as welding, brazing, or use of an adhesive material. FIG. 1A depicts an example embodiment of side 105 without cover plate(s) in place, while FIG. 1C depicts an example embodiment of side 105 with a single cover plate 132 in place and sealing the optical cavity 110 and mounting area 115.

As shown in FIG. 1B, a second side 135 of the resonator 100 features an optical cavity 140 within which one or more optical elements (e.g., mirrors, prisms, lenses, etc.) are utilized to manipulate laser beams emitted by one or more (typically a plurality of) beam emitters. In various embodiments, as detailed below with reference to FIGS. 4A and 4B, the optical cavities 110, 140 may be portions of the same, larger optical cavity, e.g., an external lasing cavity, and the beams may travel from optical cavity 110 to optical cavity 140 via one or more apertures defined through the base plate of the resonator 100.

Also on side 135 is a liquid coolant cavity 145. The liquid coolant cavity 145 is, in various embodiments, a hollow cavity configured to contain liquid coolant (e.g., water, glycol, or other heat-transfer fluid) directly beneath the mounting area 115. As shown, the liquid coolant may flow into and out of the cavity 145 via a fluid inlet 150 and a fluid outlet 155, which may be fluidly coupled to, e.g., a reservoir of coolant and/or a heat exchanger for cooling fluid heated by the beam emitters. As detailed in the '134 application, embodiments of the invention may feature a control system that controls the rate of fluid flow into and out of the cavity 145 based on one or more sensed characteristics, e.g., temperature of the beam emitters, the cooling fluid, and/or one or more other components of and/or positions within resonator 100.

Separating the optical cavity 140 from the liquid coolant cavity 145 is an isolation wall 160 extending from the base plate of the resonator 100. In FIG. 1B, the isolation wall 160 is depicted as surrounding the entirety of the optical cavity 140, but in other embodiments of the invention the isolation wall 160 may be disposed only directly between the optical cavity 140 and the liquid coolant cavity 145. As with side 105, the optical cavity 140 and liquid coolant cavity 145 are surrounded by the protruding external wall 120. In various embodiments, the isolation wall 160 extends along one or more sides of the liquid coolant cavity 145, in order to seal the liquid coolant cavity 145 away from the optical cavity 140. In various embodiments, the isolation wall 160 and the external wall 120 collectively entirely surround the liquid coolant cavity 145; that is, the isolation wall 160 may extend along one or more sides of the liquid coolant cavity 145 that are not adjacent to the external wall 120. In the exemplary embodiment depicted in FIG. 1B, the external wall 120 extends along two adjoining sides of the liquid coolant cavity 145 while the isolation wall 160 extends along the other two adjacent sides.

Figure 1D:
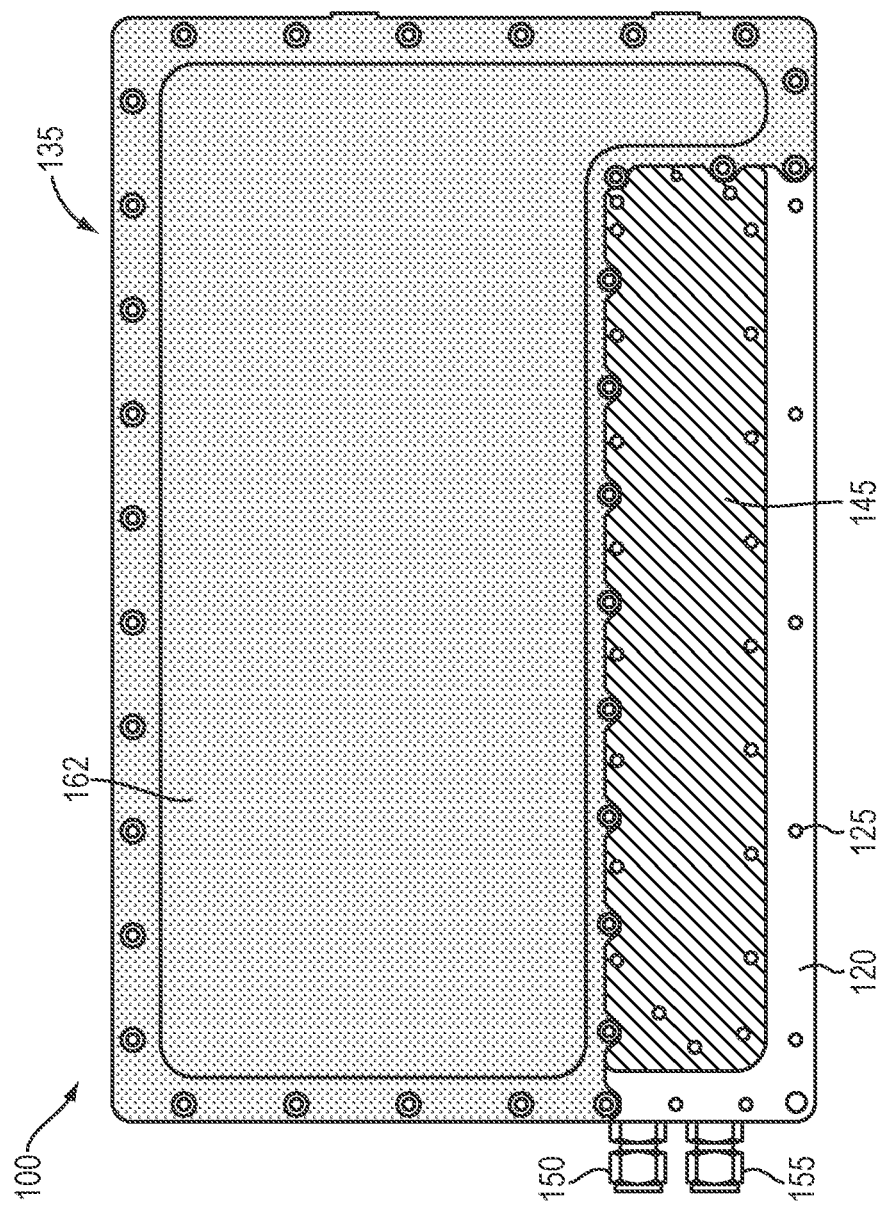
FIG. 1D is a schematic view of the second side of the laser resonator of FIG. 1B with a cover plate in place in accordance with various embodiments of the invention.

A sealing path 165 may be defined around the optical cavity 140 and may, in various embodiments, correspond at least in part to the location of the isolation wall 160. In various embodiments, and as shown in FIG. 1D, a cover plate 162 may be disposed over side 135 and may be fastened to resonator 100 via fasteners (e.g., screws, bolts, rivets, etc.) that extend into (and may mechanically engage with, e.g., threadingly engage with) apertures 125. In other embodiments, the cover plate 162 may be sealed along the sealing path 165 via a technique such as welding, brazing, or use of an adhesive material. In various embodiments, and as shown in FIG. 1D, the optical cavity 140 may be sealed without sealing or covering of the optical coolant cavity 145 (which, then, in various embodiments may house an enclosed reservoir for containing liquid coolant), thereby leaving the optical coolant cavity 145 accessible (e.g., for service, maintenance, or cleaning) without the need to unseal or expose the more delicate components disposed within the optical cavity 140. In other embodiments, the cover plate 162 (or two or more cover plates) may be used to cover and/or seal the entire side 135 of the resonator 100, including the optical coolant cavity 145. For example, in various embodiments, cover plate 162 may cover the optical cavity 140 as shown in FIG. 1D, while a second cover plate may be utilized to cover the optical coolant cavity 145.

Figure 2:
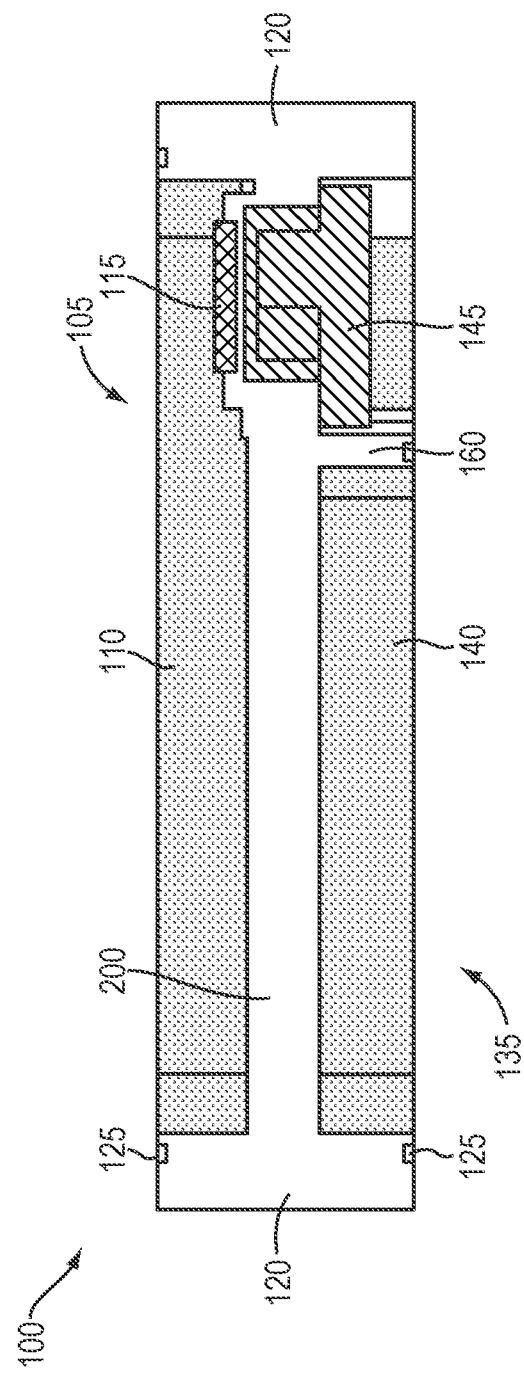
FIG. 2 is a schematic cross-sectional view of a laser resonator in accordance with various embodiments of the invention.

FIG. 2 is a schematic cross-sectional view of the resonator 100, depicting sides 105, 135 of the resonator 100 separated by base plate 200. As shown, the thickness of the base plate 200 in the region directly below the optical cavity 140 may be substantially constant. For example, in various embodiments the thickness of the base plate 200 in the region directly below the optical cavity 140 may range from approximately 5 mm to approximately 35 mm, or even from approximately 5 mm to approximately 50 mm. In various embodiments, the thickness of the base plate 200 in the region directly below the optical cavity 140 may depend upon the overall size of the resonator 100, e.g., the thickness may increase with increasing resonator size. In the region between the mounting area 115 and the liquid coolant cavity 145, the thickness of the base plate 200 may be considerably smaller, in order to enable the liquid coolant to more effectively conduct heat away from the mounting area 115. For example, the thickness of the base plate 200 in the region between the mounting area 115 and the liquid coolant cavity 145 may range from approximately 0.5 mm to approximately 3 mm.

As shown in FIG. 2, the isolation wall 160 separates the liquid coolant cavity 145 from the optical cavity 140 and provides additional mechanical stability to the resonator 100. As shown, the height of the isolation wall 160 may be approximately equal to the depth of the optical cavity 140 and/or the height of the portion of the external wall 120 that extends beyond the base plate 200. In various embodiments, this height may range from approximately 5 mm to approximately 150 mm, depending upon the size of the resonator 100. (Thus, the total "height" or thickness of the external wall 120 may range from approximately 10 mm to approximately 300 mm.)

The thickness (i.e., the horizontal dimension in FIG. 2) of the isolation wall 160 and/or of the external wall 120 may range from approximately 1 mm to approximately 75 mm. As shown in FIG. 2, the thickness of the isolation wall 160 may be less than the thickness of the external wall 120. In various embodiments, the thickness of the isolation wall 160 may range from approximately 50% to approximately 75% of the thickness of the external wall 120. In other embodiments, the thickness of the isolation wall 160 may be approximately equal to the thickness of the external wall 120. In various embodiments, the ratio of the thickness of the isolation wall 160 to the thickness of the external wall 120 may range from approximately 0.5 to approximately 1.5. As mentioned above, the presence of the isolation wall 160 may enable the thickness of the base plate 200 to be reduced without significantly compromising the mechanical stability of the resonator 100.

During operation of the beam emitters in mounting area 115 (e.g., during operation and/or testing of the resonator 100), heat produced thereby may heat the base plate 200 (and/or one or more other portions of the resonator 100), resulting in thermal expansion thereof. Such thermal expansion may tend to produce a bending force on the resonator 100 that tends to bend side 105 outward and, correspondingly, side 135 inward. In various embodiments, the isolation wall 160 resists such bending forces, minimizing or substantially preventing deformation and/or bending of the resonator 100 (e.g., the base plate 200). In this manner, the precise optical alignment of the various optical elements within the optical cavities 110, 140 is maintained, even during operation of the beam emitters.

In various embodiments, the isolation wall 160, base plate 200, and external wall 120 (and/or cover plates configured to cover optical cavities 110, 140) may include, consist essentially of, or consist of one or more rigid materials, e.g., stainless steel, copper, magnesium, and/or aluminum. In various embodiments of the invention, such rigid materials may have a Young's modulus ranging from approximately 30 GPa to approximately 450 GPa, or even larger. The use of stronger, more rigid materials may enable the use of designs having smaller thicknesses, while the use of less rigid materials may require one or more thicker components. As shown in FIG. 2, the isolation wall 160 may protrude upward from the base plate 200 and may include, consist essentially of, or consist of a portion of the same material of the base plate 200. That is, a solid piece of material may be machined or otherwise shaped to define the shapes of the base plate 200, the external wall 120, and the isolation wall 160. In other embodiments, the isolation wall 160 may include, consist essentially of, or consist of a material different from that of the base plate 200 and/or may be attached to the base plate 200 via, e.g., welding, brazing, soldering, or another attachment technique. In various embodiments, since the isolation wall 160 is not exposed to cooling fluid during typical use, the isolation wall 160 need not be substantially corrosion-resistant; rather, the material for isolation wall 160 may be selected to provide mechanical strength even at small thicknesses.

While in FIG. 2 the thickness of the isolation wall 160 is depicted as being approximately constant along the entire height of isolation wall 160, in various other embodiments the thickness of isolation wall 160 may vary along the height of isolation wall 160. For example, the thickness of isolation wall 160 at the interface between isolation wall 160 and base plate 200 may be smaller than or larger than the thickness at the opposing end of isolation wall 160. The thickness of isolation wall 160 may vary gradually over all or a portion of its height, or the thickness may vary in one or more discrete steps along the height of the isolation wall.

Figure 3:
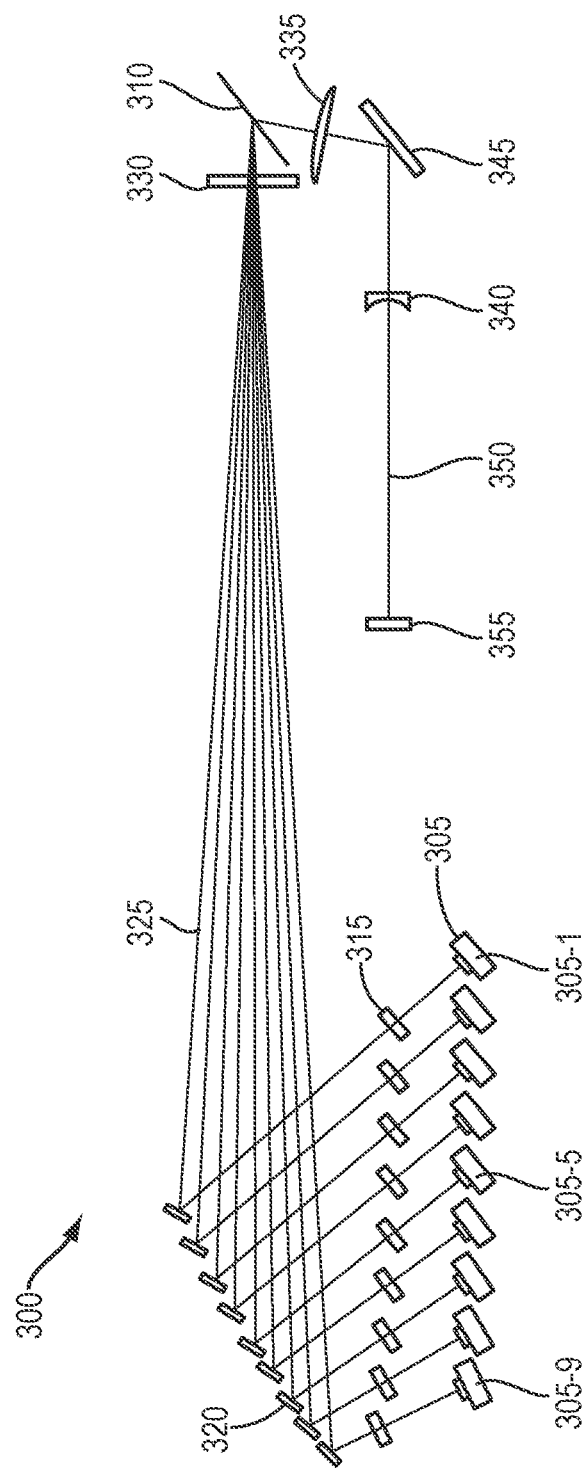
FIG. 3 is a schematic view of components of a wavelength beam combining laser system that may be incorporated into a laser resonator in accordance with various embodiments of the invention.

Resonators in accordance with embodiments of the present invention may be utilized in WBC laser systems. While exemplary embodiments include WBC resonators, embodiments of the invention may also be utilized with other types of laser resonators utilizing one or more beam emitters. FIG. 3 schematically depicts various components of a WBC resonator 300 that may be utilized in embodiments of the present invention. In the depicted embodiment, resonator 300 combines the beams emitted by nine different diode bars (as utilized herein, "diode bar" refers to any multi-beam emitter, i.e., an emitter from which multiple beams are emitted from a single package). Embodiments of the invention may be utilized with fewer or more than nine emitters. In accordance with embodiments of the invention, each emitter may emit a single beam, or, each of the emitters may emit multiple beams. The view of FIG. 3 is along the WBC dimension, i.e., the dimension in which the beams from the bars are combined. The exemplary resonator 300 features nine diode bars 305, and each diode bar 305 includes, consists essentially of, or consists of an array (e.g., one-dimensional array) of emitters along the WBC dimension. In various embodiments, each emitter of a diode bar 305 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 305 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 305 toward a dispersive element 310. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

In embodiments of the invention in which both a FAC lens and an optical twister (e.g., as a microlens assembly) are associated with each of the beam emitters and/or emitted beams, and slow-axis collimator (SAC) lenses may be utilized to manipulate the beams in the non-WBC dimension. In other embodiments, the emitted beams are not rotated, and FAC lenses may be utilized to manipulate the beams in the non-WBC dimension. Thus, it is understood that references to SAC lenses herein generally refer to lenses having power in the non-WBC dimension, and such lenses may include FAC lenses in various embodiments. Thus, in various embodiments, for example embodiments in which emitted beams are not rotated and/or the fast axes of the beams are in the non-WBC dimension, FAC lenses may be utilized as detailed herein as replacements for SAC lenses, and vice versa.

As shown in FIG. 3, resonator 300 also features a set of SAC lenses 315, one SAC lens 315 associated with, and receiving beams from, one of the diode bars 305. Each of the SAC lenses 315 collimates the slow axes of the beams emitted from a single diode bar 305. After collimation in the slow axis by the SAC lenses 315, the beams propagate to a set of interleaving mirrors 320, which redirect the beams 325 toward the dispersive element 310. The arrangement of the interleaving mirrors 320 enables the free space between the diode bars 305 (and the beams emitted thereby) to be reduced or minimized. Upstream of the dispersive element 310 (which may include, consist essentially of, or consist of, for example, a diffraction grating such as the transmissive diffraction grating depicted in FIG. 3, or a reflective diffraction grating), a lens 330 may optionally be utilized to collimate the sub-beams (i.e., emitted rays other than the chief rays) from the diode bars 305. In various embodiments, the lens 330 is disposed at an optical distance away from the diode bars 305 that is substantially equal to the focal length of the lens 330. Note that, in typical embodiments, the overlap of the chief rays at the dispersive element 310 is primarily due to the redirection of the interleaving mirrors 320, rather than the focusing power of the lens 330.

As detailed in U.S. Pat. No. 10,268,043, filed on Jan. 19, 2017 (the '043 patent), the entire disclosure of which is incorporated by reference herein, the dispersive element may include, associated therewith, proximate thereto, or in contact therewith, one or more prisms. That is, references to a dispersive element herein may refer to combinations of, for example, a diffraction grating and one or more prisms. In various embodiments, the one or more prisms may improve WBC beam quality.

Also depicted in FIG. 3 are lenses 335, 340, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of each of which is hereby incorporated by reference herein. Resonator 300 may also include one or more optional folding mirrors 345 for redirection of the beams such that the resonator 300 may fit within a smaller physical footprint. The dispersive element 310 combines the beams from the diode bars 305 into a single, multi-wavelength beam 350, which propagates to a partially reflective output coupler 355. The coupler 355 transmits a portion of the beam as the output beam of resonator 300 while reflecting another portion of the beam back to the dispersive element 310 and thence to the diode bars 305 as feedback to stabilize the emission wavelengths of each of the beams. In this manner, an external-cavity lasing system, in which the secondary mirror for each emitter is disposed at a distance away from the emission aperture or facet of the emitter, is formed in resonator 300.

In various embodiments of the invention, a laser system incorporates multiple resonators 300 each configured as shown for resonator 100, and the output beams from the resonators 300 are combined downstream (e.g., within a housing and/or by one or more optical elements) into a single output beam that may be directed to a workpiece for processing (e.g., welding, cutting, annealing, etc.) and/or coupled into an optical fiber.

Various embodiments of the invention implement an external cavity laser system on resonator 100 and reduce the required size of resonator 100 by utilizing optical cavities 110, 140 as portions of a larger optical cavity. Reflectors such as mirrors may be utilized to direct the beams within the optical cavity, and, since the optical cavity extends along both sides 105, 135, the overall size of the resonator 100 may be correspondingly reduced for the same cavity size (e.g., compared to a resonator having an optical cavity on only one side). In various embodiments, splitting the optical cavity of the resonator onto both sides of the resonator module may not only reduce the required size of the resonator, but may also reduce deleterious strains and/or deformation due to heat generated by the optical components in the optical cavity. That is, thermal effects are less likely to deform the resonator toward one side or the other since heat may be generated on both sides of the module.

Figure 4A:
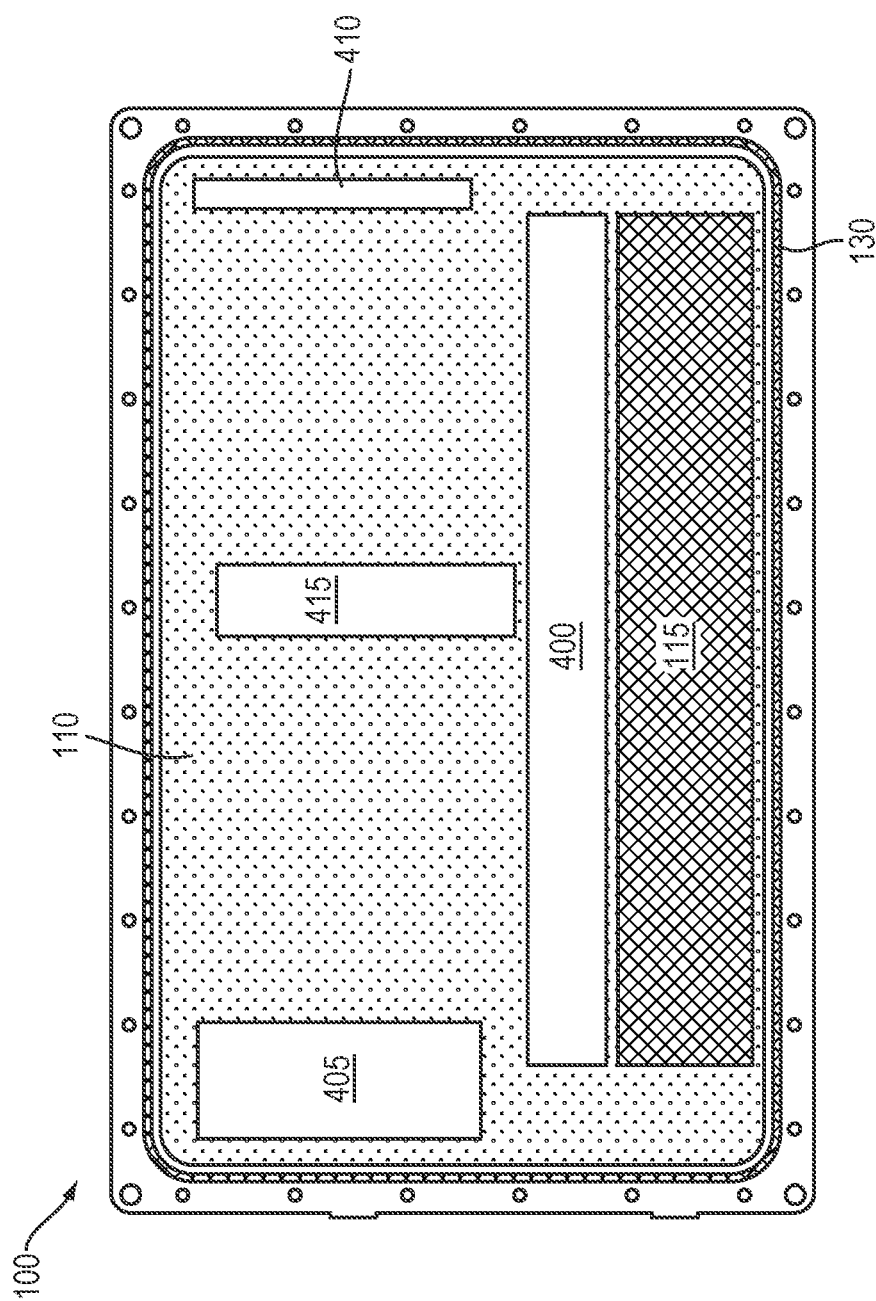
FIG. 4A is a schematic view of a first side of a laser resonator in accordance with various embodiments of the invention.
Figure 4B:
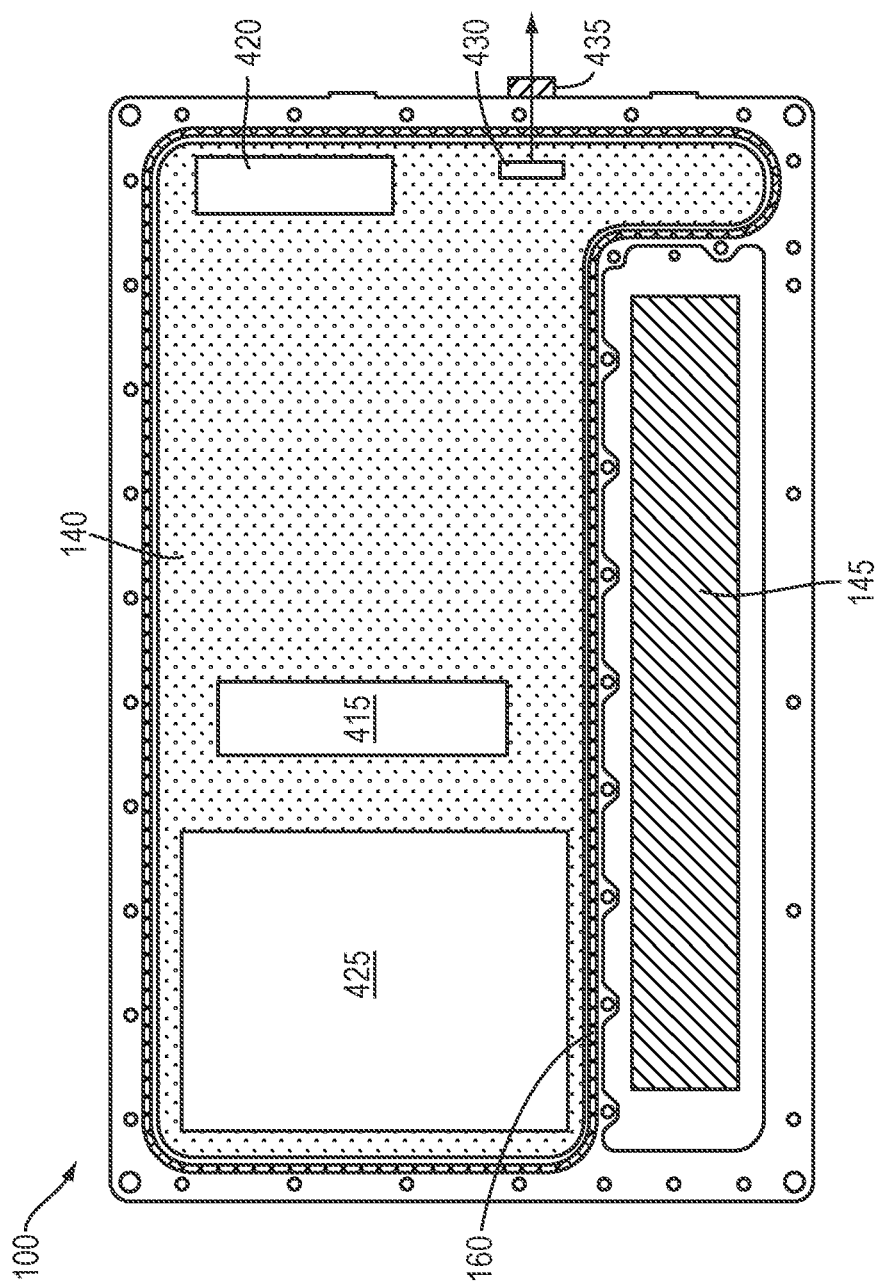
FIG. 4B is a schematic view of a second side of a laser resonator in accordance with various embodiments of the invention.

In an exemplary embodiment, as shown in FIGS. 4A and 4B, beams from beam emitters disposed in mounting area 115 may be focused by a group of lenses (and/or other optical elements; for example, SAC lenses 315) disposed in lens area 400 toward a group of mirrors in a mirror area 405 (which may contain, in various embodiments, interleaver mirrors 320). In various embodiments, the beam emitters may be mounted over the base plate as detailed within, for example, U.S. patent application Ser. No. 16/597,949, filed on Oct. 10, 2019, the entire disclosure of which is incorporated by reference herein. In various embodiments, each beam emitter may be mounted on and thermally coupled to an impingement-style cooling apparatus utilizing cooling fluid from the liquid coolant cavity, for example as described in U.S. patent application Ser. No. 16/654,339, filed on Oct. 16, 2019, the entire disclosure of which is incorporated by reference herein.

From mirror area 405, the beams from the beam emitters may be directed to another mirror area 410 (containing one or more reflectors such as mirrors, e.g., folding mirrors) and thence through an opening 415 to optical cavity 140 on side 135. Although the example embodiment depicted in FIGS. 4A and 4B features one opening 415, in accordance with various embodiments of the invention, resonators feature two or more openings through the base plate, one or more (or even all) of which may be positioned, shaped, or otherwise configured to enable beams to pass from one side of the resonator to the other. In optical cavity 140, the beams may be directed to a mirror area 420 (containing one or more reflectors such as mirrors, e.g., folding mirrors), which reflects the beams to a beam-combining area 425. In example embodiments, the beam-combining area 425 may include therewithin the diffusive element 310 (and, in some embodiments, the output coupler 355). In various embodiments, the beams each have a different wavelength, and the beams are combined in beam-combining area 425 into an output beam composed of the multiple wavelengths. The beam from the beam-combining area 425 may be directed to a mirror 430 (which, in various embodiments, may be partially reflective output coupler 355) and thence to an output 435 for emission from the resonator 100. For example, the output 435 may be a window for emission of the beam therethrough or an optical coupler configured to connect to an optical fiber. In various embodiments, as detailed in the '728 application, the output 435 may be rotatively adjustable (for example, about a pair of perpendicular coordinate axes that may be parallel to the face or end of the resonator 100).

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser resonator comprising:
    a base plate (i) having a first side and a second side opposite the first side and (ii) surrounded by an external wall, the external wall protruding from the base plate on both the first side and the second side;
    disposed on the first side of the base plate, (i) a mounting area configured to receive a plurality of beam emitters, and (ii) a first optical cavity for manipulation of beams emitted by the beam emitters;
    disposed on the second side of the base plate, (i) a liquid coolant cavity disposed beneath the mounting area and configured to receive liquid coolant therewithin, (ii) a second optical cavity, and (iii) an isolation wall extending from the base plate and disposed between the liquid coolant cavity and the second optical cavity;
    a fluid inlet for supplying the liquid coolant to the liquid coolant cavity; and
    a fluid outlet for receiving the liquid coolant from the liquid coolant cavity; wherein the base plate defines an opening therethrough, and the second optical cavity is configured to receive beams from the first optical cavity through the opening.

2. The laser resonator of claim 1, wherein a thickness of a first portion of the base plate disposed between the first optical cavity and the second optical cavity is greater than a thickness of a second portion of the base plate disposed between the liquid coolant cavity and the mounting area.

3. The laser resonator of claim 1, wherein a thickness of the isolation wall is less than or approximately equal to a thickness of the external wall.

4. The laser resonator of claim 1, wherein a height of the isolation wall is approximately equal to a height of a portion of the external wall extending from the second side of the base plate.

5. The laser resonator of claim 1, wherein the isolation wall surrounds an entirety of a perimeter of the second optical cavity.

6. The laser resonator of claim 1, wherein a perimeter of the liquid coolant cavity is surrounded by the isolation wall.

7. The laser resonator of claim 1, wherein a perimeter of the liquid coolant cavity is collectively surrounded by the isolation wall and the external wall.

8. The laser resonator of claim 7, wherein the external wall abuts one or more sides of the liquid coolant cavity, and the isolation wall abuts one or more sides of the liquid coolant cavity.

9. The laser resonator of claim 1, further comprising a first cover plate configured to seal against a sealing path surrounding a perimeter of, and thereby enclose, the first optical cavity and the mounting area.

10. The laser resonator of claim 1, further comprising a second cover plate configured to seal against a sealing path surrounding a perimeter of the second optical cavity, thereby enclosing the second optical cavity.

11. The laser resonator of claim 10, wherein the second cover plate does not cover or enclose the liquid coolant cavity.

12. The laser resonator of claim 1, further comprising, disposed within the second optical cavity, (i) a dispersive element for combining a plurality of beams into a multi-wavelength beam, and (ii) a partially reflective output coupler for receiving the multi-wavelength beam from the dispersive element, transmitting a first portion of the multi-wavelength beam as an output beam, and reflecting a second portion of the multi-wavelength beam back toward the dispersive element.

13. The laser resonator of claim 12, wherein the dispersive element comprises a diffraction grating.

14. The laser resonator of claim 1, further comprising the plurality of beam emitters received within the mounting area.

15. The laser resonator of claim 14, wherein at least one of the beam emitters is a diode bar configured to emit a plurality of discrete beams.

16. The laser resonator of claim 1, further comprising one or more optical elements disposed within the first optical cavity.

17. The laser resonator of claim 1, further comprising one or more optical elements disposed within the second optical cavity.

18. The laser resonator of claim 1, wherein the isolation wall and the base plate are portions of a single volume of material.

19. The laser resonator of claim 1, wherein the isolation wall is attached to the base plate.

20. The laser resonator of claim 19, wherein the isolation wall is attached to the base plate via at least one of an adhesive material, a solder joint, or a brazing joint.

21. The laser resonator of claim 1, wherein the isolation wall comprises a first material, the base plate comprises a second material, and the first and second materials are the same.

22. The laser resonator of claim 1, wherein the isolation wall comprises a first material, the base plate comprises a second material, and the first and second materials are different.

23. The laser resonator of claim 1, further comprising a fluid reservoir configured to fit within the liquid coolant cavity and contain the liquid coolant.

* * * * *